(12) United States Patent
Nguyen

(10) Patent No.: US 6,754,946 B2
(45) Date of Patent: Jun. 29, 2004

(54) INTEGRALLY FORMED RECTIFIER FOR INTERNAL ALTERNATOR REGULATOR (IAR) STYLE ALTERNATOR

(75) Inventor: An Huu Nguyen, Orlando, FL (US)

(73) Assignee: Wetherill Associates, Inc., Royersford, PA (US)

( * ) Notice: Subject to any disclaimer, the term of this patent is extended or adjusted under 35 U.S.C. 154(b) by 0 days.

(21) Appl. No.: 10/670,481

(22) Filed: Sep. 25, 2003

(65) Prior Publication Data

US 2004/0040144 A1 Mar. 4, 2004

Related U.S. Application Data

(62) Division of application No. 10/228,389, filed on Aug. 26, 2002.

(51) Int. Cl.[7] .................. H02K 15/00; H02K 15/14; H02K 15/16
(52) U.S. Cl. .................. 29/596; 29/598; 29/831; 310/68 D; 310/64
(58) Field of Search .................. 29/596, 598, 831; 310/68 D, 64

(56) References Cited

U.S. PATENT DOCUMENTS

| | | | |
|---|---|---|---|
| 3,777,193 A | | 12/1973 | Buehner .................. 310/68 D |
| 3,979,659 A | | 9/1976 | Lynch, Jr. et al. .......... 321/8 R |
| 4,189,653 A | | 2/1980 | Hiratuka et al. .......... 310/68 D |
| 4,412,377 A | * | 11/1983 | Nagashima et al. .......... 29/832 |
| 4,538,169 A | * | 8/1985 | Smith et al. .................. 257/717 |
| 4,799,309 A | * | 1/1989 | Cinzori et al. ................ 29/596 |
| 5,238,704 A | * | 8/1993 | Yamaguchi .................. 427/104 |
| 5,821,674 A | * | 10/1998 | Weiner ...................... 310/68 D |
| 5,866,963 A | | 2/1999 | Weiner et al. ............ 310/68 D |
| 6,107,710 A | | 8/2000 | Gamboa ................... 310/67 R |
| 6,140,722 A | | 10/2000 | Ballard et al. ............ 310/68 D |
| 6,150,196 A | * | 11/2000 | Tanaka et al. .............. 438/122 |
| 6,252,320 B1 | | 6/2001 | Ballard et al. ............ 310/68 D |
| 6,278,206 B1 | * | 8/2001 | Yockey et al. ................ 310/71 |
| 6,327,128 B1 | | 12/2001 | De Petris .................... 361/103 |
| 2001/0010436 A1 | | 8/2001 | Ballard et al. ............ 310/68 D |
| 2002/0042218 A1 | | 4/2002 | De Petris .................... 439/246 |
| 2003/0042808 A1 | | 3/2003 | Keidar et al. ............. 310/68 D |

* cited by examiner

Primary Examiner—Thanh Lam
(74) Attorney, Agent, or Firm—Allen, Dyer, Doppelt, Milbrath & Gilchrist, P.A.

(57) ABSTRACT

A rectifier and method for forming the rectifier for an internal alternator regulator (IAR) style alternator includes an integrally formed rectifier body having a ground engaging surface that mounts within the alternator and is grounded through an automotive grounding system. A diode receiving cavity is opposite the ground engaging surface. A plurality of negative diodes are secured within the diode receiving cavity and grounded thereto. An insulated conductor substrate is positioned in the diode receiving cavity and has a conductive surface that is insulated from the rectifier body and negative diodes. Positive diodes are secured on the insulated conductive substrate. A terminal connector interconnects negative and positive diodes in a preferred bridge rectifier configuration.

19 Claims, 12 Drawing Sheets

INTEGRALLY FORMED RECTIFIER FOR INTERNAL ALTERNATOR REGULATOR (IAR) STYLE ALTERNATOR

This application is a divisional of Ser. No. 10/228,389 filed Aug. 26, 2002. the disclosure of which is hereby incorporated by reference in its entirety.

FIELD OF THE INVENTION

This invention relates to rectifiers used in alternators of automobiles, and more particularly, this invention relates to a rectifier having an improved heat dissipation and cooling ability for use with Internal Alternator Regulator (IAR) style alternators.

BACKGROUND OF THE INVENTION

Most automotive systems use the automobile engine to drive an alternator via a belt transmission or similar driving transmission that rotates a drive shaft of the alternator, which includes a rotor coil where a magnetic field is generated. A stator is positioned about the rotor coil and positioned in the magnetic field. The stator windings are wound about stator laminations in typically a three-phase configuration. As the engine drives the belt transmission, the alternator drive shaft rotates and an electric current is induced in the stator windings.

In these types of automotive alternator systems, the alternating current induced in the stator windings is converted to a direct current by a rectifier that is electrically connected to the stator windings. In many prior art alternator designs, including an IAR style alternator, an internal or integrated alternator/regulator is positioned in the alternator housing, such as disclosed in U.S. Pat. Nos. 6,252,320; 6,140,722; 5,821,674; and 6,107,710.

The '722 and '320 patents disclose a prior art rectifier having a thin, negative heat sink plate and a positive connector plate positioned on the negative heat sink plate. A housing cover extends over the negative heat sink plate. Negative diodes are positioned on the negative heat sink plate. Positive diodes are positioned on the positive connector plate. The cover carries various terminals and connects to a B+ post secured typically by soldering to the positive connector plate.

An improvement over that type of prior art rectifier design is disclosed in the '722 and '320 patents by using first and second diode mounting plates that define negative and positive heat sinks. Openings are formed in each plate and dimensioned to receive a diode in a press fit relationship. A connector housing includes a connector box having a recess to receive a wiring harness, a B+ post, and other components used for AC power rectification.

Other rectifier designs, such as disclosed in the '674 patent, also include a negative and positive heat sink plate. Some prior art rectifier designs use more substantial negative and positive heat sink plates having greater mass to enable heat transfer. A gasket separates the positive and negative heat sink plates. Some of these rectifiers use multiple heat sink plates and separate components for both the positive and negative heat sink plates. Other prior art rectifiers use complicated lead integument connectors or a connector for connecting rectifier diode circuits and other circuit components to a wiring harness.

Many of these prior art rectifiers do not provide sufficient thermal mass for allowing heat transfer from the diodes and through the rectifier, and thus, the diodes often fail in operation. Also, the separate negative and positive heat sink plates in some designs require additional manufacturing steps that increase assembly time and costs. The use of a B+ post for battery connection may also require a separate soldering step to secure the B+ post onto a heat sink and another solder connection for a lateral terminal connector to the post. This also adds increased cost and assembly steps.

Some prior art rectifiers increase the size of the negative heat sink plate to enhance heat conduction from the diodes, through the heat sink plate, and to the alternator body on which the rectifier is mounted. Usually, a dielectric is plasma sprayed on the heat sink plate. An example is aluminum oxide. It is applied onto the negative heat sink plate. A layer of copper or other metallic material is applied onto the aluminum oxide to form an electrically insulated layer on which positive diodes can be placed. Various terminals interconnect the positive and negative diodes in a typical bridge rectifier arrangement, which is then interconnected to a connector housing that allows a wiring harness to be connected thereto.

Although the larger heat sink plates supply some additional cooling capacity, the positive diodes do not transfer heat adequately in that type of system.

SUMMARY OF THE INVENTION

It is therefore an object of the present invention to provide a rectifier that overcomes the drawbacks of the prior art as noted above.

It is yet another object of the present invention to provide a rectifier for an internal alternator regulator (IAR) style alternator that has improved heat sink capability and can be formed as a one-piece construction.

The rectifier of the present invention is preferably used for an IAR style alternator and includes an integrally formed rectifier body having a ground engaging surface that mounts within the alternator and is grounded through the automotive grounding system. A diode receiving cavity is formed opposite the ground engaging surface. By ground engaging surface, it is meant that the rectifier body is grounded via the grounding system of the automobile, such as through the alternator body or other means. A diode receiving cavity is formed opposite the ground engaging surface. A plurality of negative diodes are secured within the diode receiving cavity and grounded thereto. An insulated conductive substrate is positioned in the diode receiving cavity and has a conductive surface that is insulated from the rectifier body and the negative diodes secured thereto. A plurality of positive diodes are secured on the insulated conductive substrate. A terminal connector interconnects the negative and positive diodes in an electrical rectifying configuration, such as a bridge configuration.

In one aspect of the present invention, the insulated conductive substrate is formed as a dielectric layer having a circuit layer positioned thereon on which the positive diodes are secured. A metal base layer can be secured on the dielectric layer opposite the circuit layer. In yet another aspect of the present invention, the insulated conductive substrate is formed as a fiberglass reinforced bond ply material having a metal layer on both sides. Each metal layer comprises a copper layer in one preferred aspect of the present invention.

A capacitor is secured within the diode receiving cavity and operatively connected to the negative diodes and positive diodes. An epoxy filler is disposed within the diode receiving cavity and covers the diodes to protect and insulate same. Cooling fins are formed on the rectifier body to aid in heat transfer.

In yet another aspect of the present invention, a connector housing connects to the terminal connectors and has a connection for connecting to a wiring harness. A terminal connector is secured to the insulated conductive substrate and has a terminal that connects to a wiring harness. This terminal connector can include dual terminals that connect to a wiring harness.

In yet another aspect of the present invention, the rectifier body is formed from cast aluminum, but can be formed from other metallic and electrically conductive materials as suggested by those skilled in the art.

A method of forming a rectifier for an IAR style alternator is also disclosed. In the method of the present invention as a non-limiting example, the steps include the step of securing an insulative conductive substrate within a diode receiving cavity of an integrally formed rectifier body having a ground engaging surface opposite the diode receiving cavity. The ground engaging surface mounts within an alternator and is grounded through an automotive grounding system. The leads are positive and negative diodes and inserted within a terminal connector that interconnects same. The interconnected positive and negative diodes are inserted within the diode receiving cavity such that negative diodes engage the rectifier body and are grounded thereto. Positive diodes engage the insulated conductive substrate.

In yet another method aspect of the present invention, the method includes the step of securing the negative and positive electrodes within the diode receiving cavity by applying solder paste to the rectifier body within the diode receiving cavity and onto the insulated conductive substrate and securing the negative and positive diodes thereto. A capacitor can be secured within the diode receiving cavity such that the capacitor is operatively connected to the negative and positive diodes.

The method also includes the step of filling the diode receiving cavity with an epoxy filler after the diodes are secured therein. The method also includes the step of reflow soldering the rectifier in a solder oven for final assembly. A connector housing is inserted over the terminal connector and includes a connection for receiving a wiring harness and establishing electrical contact with the terminal connector. The method also includes the step of securing a terminal connector to the insulated conductor substrate and having a terminal for connecting to the wiring harness.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous over prior art IAR and similar rectifiers. It is a novel and unobvious one-piece, die-cast construction formed as a thickened heat sink with triple the cooling surface of many prior art devices. It has a thermally conductive component encapsulation and uses heavy duty 200 volt dish diodes known to those skilled in the art, allowing enhanced endurance and quality. Typical bridge rectifiers of the prior art have been notorious as a weak link in second generator alternator designs, for example as used in the internal alternator regulator (IAR) style alternator for Ford motor vehicle and similar designs. In the usual prior art stock rectifier components and rectifiers, a small cooling surface almost guarantees premature diode and other component failure when installed in quality rebuilt units having high output at a low RPM.

The rectifier of the present invention, however, has an expanded surface area and heavy duty broad-based dish diodes with thermally conductive encapsulation and a high temperature BBS receptacle and precision fit terminals to provide a standard footprint rectifier for use in automotive IAR alternators.

Figure 1:
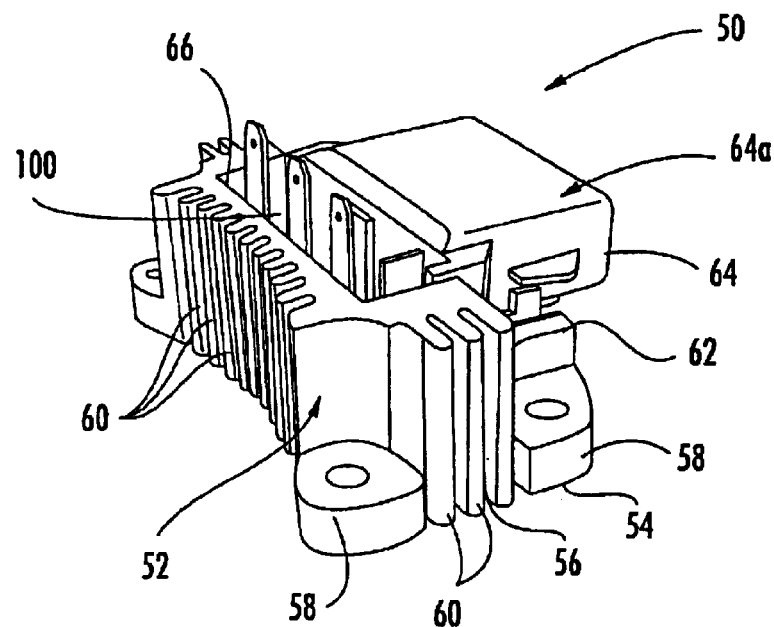
FIG. 1 is an isometric view of an assembled rectifier of the present invention and showing the integrally formed rectifier body, a terminal connector extending upward from the positive and negative diodes that are received within the diode receiving cavity (not shown), and the connector housing secured to the rectifier body and receiving the terminal connector for connecting a wiring harness.
Figure 2:
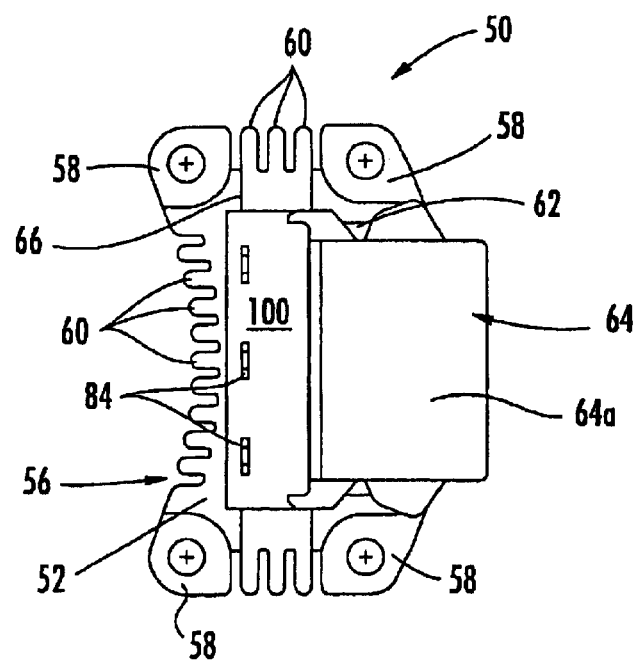
FIG. 2 is a top plan view of the rectifier shown in FIG. 1.
Figure 3:
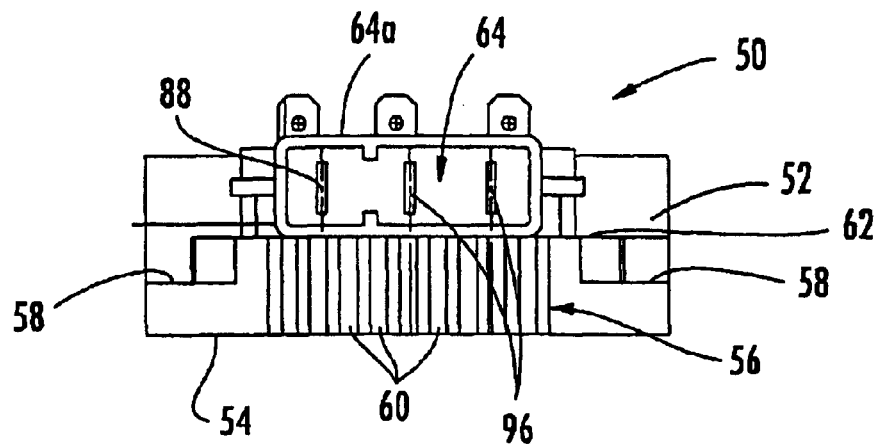
FIG. 3 is a front elevation view of the rectifier shown in FIG. 1 and looking into the connector housing at terminal connectors that receive and connect a wiring harness.

FIG. 1 is an isometric view of the assembled rectifier 50, which includes an integrally formed rectifier body 52 having a planar configured ground engaging surface 54 that mounts within an alternator body (not shown) and is grounded through an automotive grounding system. The alternator is typically an internal alternator regulator (IAR). As shown in FIGS. 1–7, the integrally formed rectifier body 52 is formed as a metallic rectifier body, for example, from a die-cast aluminum or similar material. It includes an outer cooling surface 56. The planar configured ground engaging surface 54 mounts to the interior surface of the alternator at the usual mounting location for these types of internal rectifiers. The rectifier body 52 is die-cast into the required shape for fitting within the proper mounting location of the alternator. The flat ground engaging surface 54 also provides an enhanced heat sink surface and includes four fastener tabs 58 or appendages similar to bosses, each having holes that receive screws or other fasteners for attaching the rectifier body 52 onto the internal surface of the vehicle alternator.

The footprint of the rectifier body 52 is substantially curved (concave) at front and rear sides to account for the curvature of the alternator design. The rectifier body 52 includes parallel sides, and the concave (or curved) front and rear sides. Those outer cooling surfaces 56 not containing the fastener tabs 58 have formed cooling fins 60 to allow any air blowing through the alternator to enhance the cooling effect of the design by increasing the effective surface area exposed to the blowing air.

Figure 6:
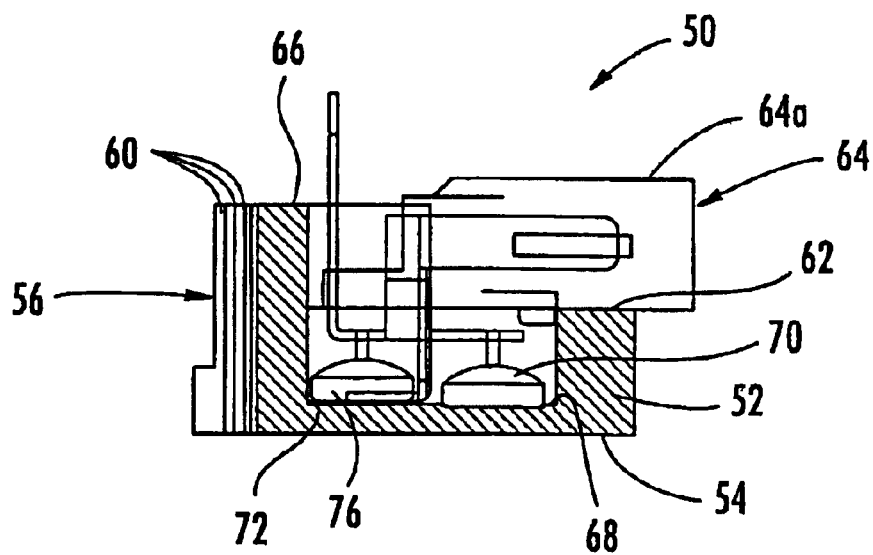
FIG. 6 is a fragmentary, side sectional view taken generally along line 6—6 of FIG. 5 and showing the diodes, terminal connectors and connector housing.
Figure 7:
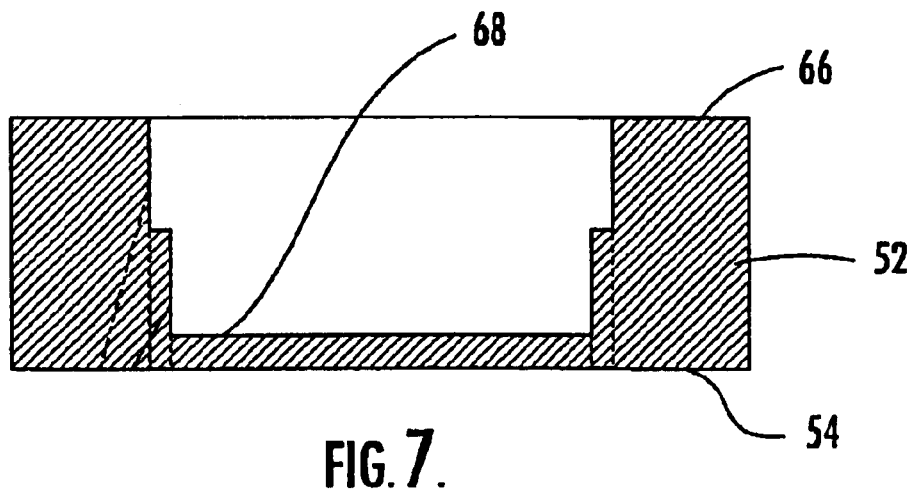
FIG. 7 is a fragmentary, front sectional view of the integrally formed rectifier body shown without diodes and other components, generally taken along line 7—7 of FIG. 4.
Figure 8:
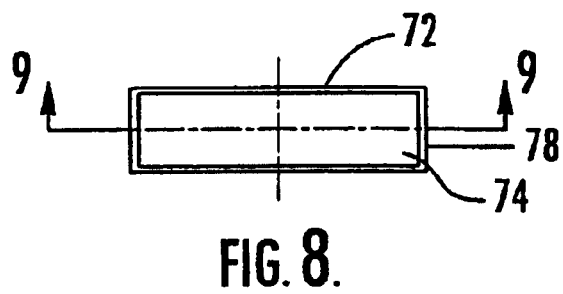
FIG. 8 is a plan view of the insulated conductive substrate shown generally in FIG. 4.

As shown in FIGS. 6 and 7, the rectifier body 52 includes a stepped down portion 62 that receives a connector housing 64 having a top surface 64a that is substantially flush with the top surface of an upper shoulder portion 66 of the rectifier body. A substantially rectangular configured diode receiving cavity 68 is formed within the rectifier body 52 opposite the ground engaging surface as shown in FIGS. 6 and 7.

Negative diodes 70 are secured within the diode receiving cavity 68 adjacent the front edge of the cavity and are grounded thereto. A rectangular configured, insulated conductive substrate 72 is positioned in the diode receiving cavity 68 adjacent the rear edge and has a conductive surface 74 that is insulated from both the rectifier body and the negative diodes secured thereto. Positive diodes 76 are secured on the insulated conductive substrate 72. In one non-limiting aspect of the invention, the insulated conductive substrate 72 is formed as a dielectric layer 78 and a circuit layer thereon and forms the conductive surface 74 on which the positive diodes 76 are secured. The substrate includes a metal base layer 80 secured on the dielectric layer 78 opposite the circuit layer forming the conductive surface 74. The metal base layer 80 and conductive surface 74 can be copper layers or other materials suggested by those skilled in the art.

An example of the type of material that could be used for the conductive substrate is a copper clad insulated metal substrate sold under the designation "Thermal Clad" as manufactured by the Bergquist Company, formed as a fiberglass reinforced bond ply material having a metal layer on both sides, such as a copper cladding. For example, a four ounce copper layer could be formed on both sides of a fiberglass reinforced bond ply. As examples, a 0.13 millimeter thick copper could be applied on a 0.15 millimeter thick fiberglass reinforced bond ply layer. A 1.5 millimeter spacing can exist between top layers and 0.25 millimeter spacing could exist between the bottom layers.

Figure 10:
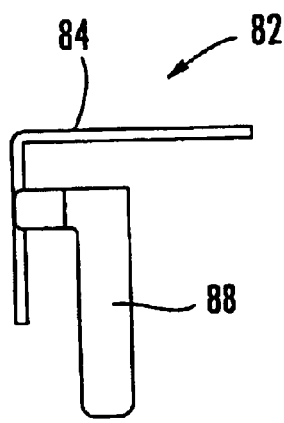
FIGS. 10–12 are respective end, top and front views of a terminal connector of the present invention that is used to interconnect positive and negative diodes.
Figure 11:
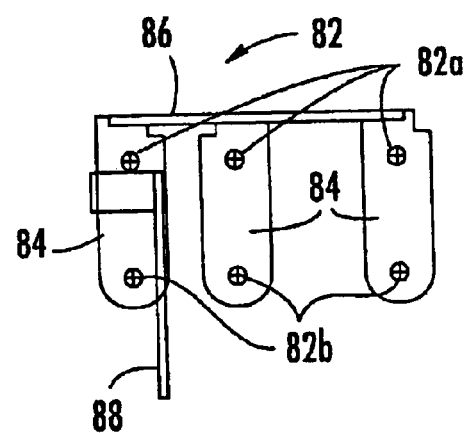
Figure 12:
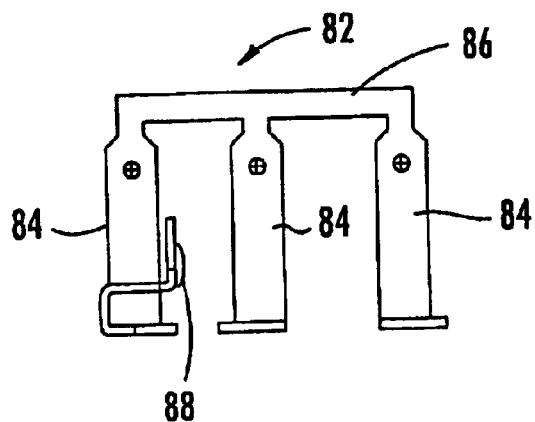

FIGS. 10–12 show respective end, top and front views of an example of a terminal connector 82 that can be used in the present invention for interconnecting the positive and negative diodes. The terminal connector 82 can be formed from brass or similar material about 0.80 thick having an electrolytic nickel as a plating layer that is about 0.1 through 0.3 mil thick, as a non-limiting example. As illustrated, the terminal connector 82 includes three substantially L-shaped leg members 84 that are interconnected at an upper portion of each leg. An alignment bar 86 that interconnects the leg member (later broken off after assembly) aids in aligning the terminal connector during assembly. One of the leg members at an end includes an upstanding terminal blade 88. The use of the terminal connectors shown in FIGS. 10–12 and the assembly process will be described below relative to FIGS. 16–31.

Figure 4:
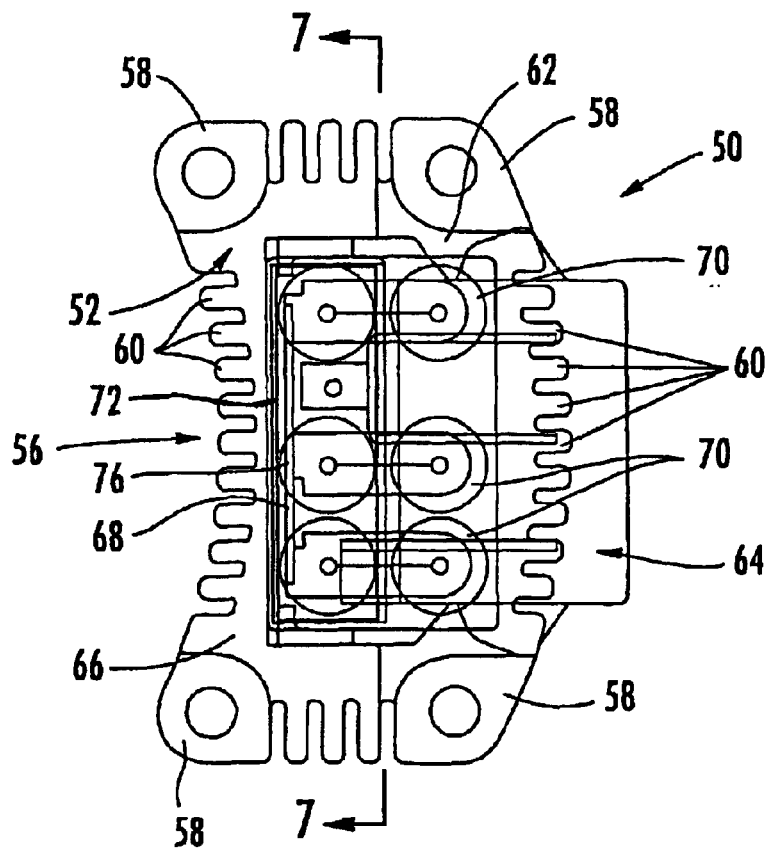
FIG. 4 is a fragmentary plan view similar to the plan view of FIG. 2, but showing negative and positive diodes, the insulated conductive substrate on which positive diodes are secured, and terminal connectors.
Figure 5:
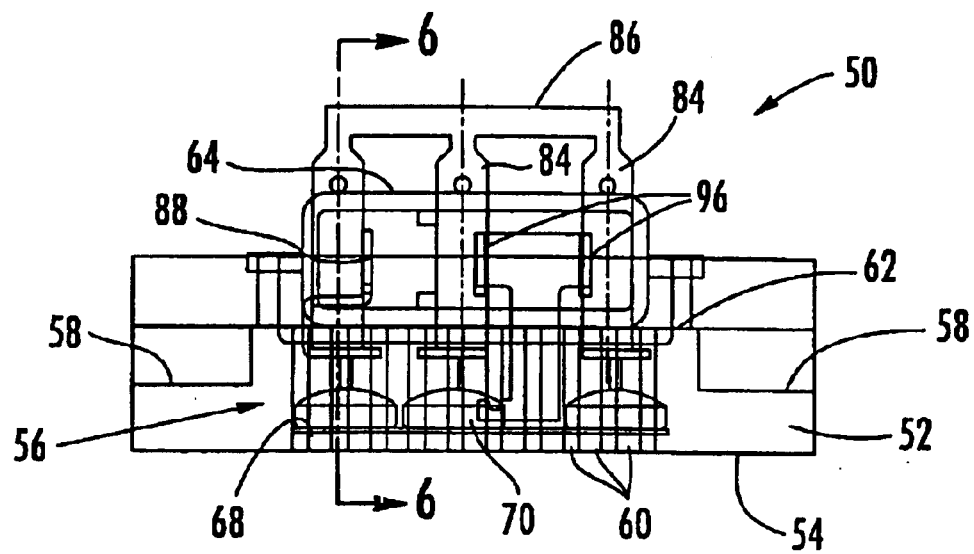
FIG. 5 is another front elevation view similar to FIG. 3, but showing the diodes and terminal connectors, and an alignment bar that is later broken during assembly.
Figure 13:
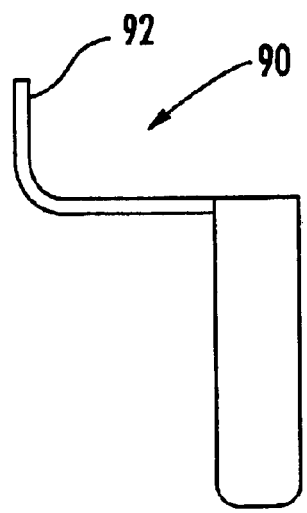
FIGS. 13–15 are respective side, top and front views of a terminal connector that is secured onto the insulated conductive substrate for a B+ connection.
Figure 14:
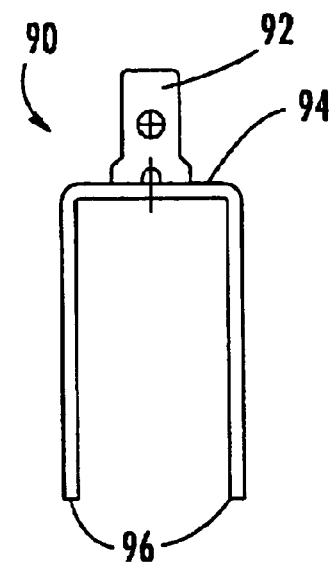
Figure 15:
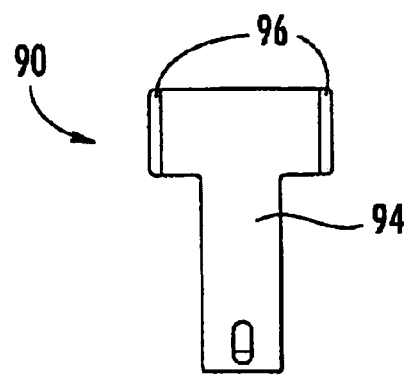

Another terminal connector 90 that substitutes as a B+ post of prior art designs is shown in FIGS. 13–15, illustrating respective side, top and front views of the terminal connector. As illustrated, this terminal connector 90 includes a foot member 92 to allow the end having the foot member 92 to be soldered onto the insulated conductive substrate 72, as shown in FIGS. 4 and 6. An upstanding conductor leg 94 splits into dual terminals 96 that connect a wiring harness (not shown). As shown in FIGS. 1–6, a connector housing 98 is secured to the rectifier body 52 and receives the dual terminals 96 from the terminal connector acting as a B+ post. The terminal blade 88 of the terminal connector 82 connects the positive and negative diodes 70, 76.

An epoxy filler 100 is inserted into the remainder of the diode receiving cavity once all components have been assembled and reflow soldered within a reflow soldering oven, as will be explained below. After assembly, the alignment bar 86 is broken to form the individual terminals that extend upward from the rectifier as shown in FIG. 1.

Referring now to FIGS. 16–31, a sequence of steps is illustrated for assembling the rectifier 50 of the present invention. Typically, a limited amount of equipment is necessary for assembling the rectifier of the present invention. A soldering iron, reflow oven, tweezers, assembly fixture for holding the various components, and an epoxy dispense station are required.

The description as provided is an exemplary method of steps that can be used for the final assembly of the rectifier of the present invention. Naturally, other steps as suggested by those skilled in the art can be provided. A first step could be a manual diode modification where positive diode leads are cut to about 10.1 millimeters using a positive diode fixture (not shown), as known to those skilled in the art. Negative diode leads can be cut to about 8.6 millimeters using a negative diode fixture (not shown).

Figure 9:
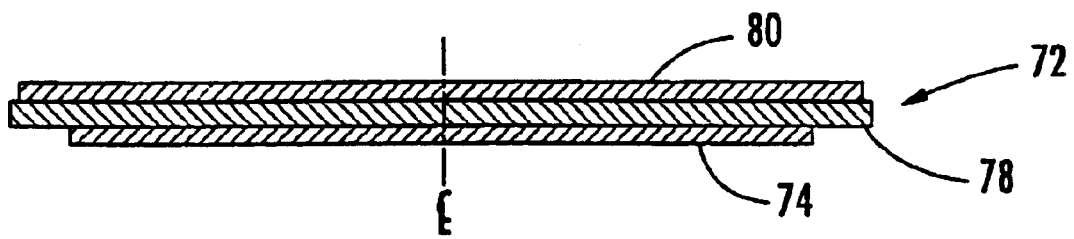
FIG. 9 is a sectional view of the substrate taken along line 9—9 of FIGS. 8 and 4 showing the middle, dielectric layers and outer metal layers.
Figure 16:
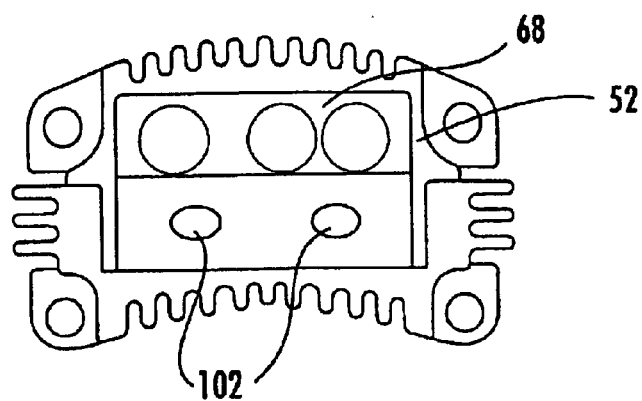
FIGS. 16–31 are views of the rectifier of the present invention in various stages of assembly showing examples of the types of steps used in making the rectifier.
Figure 17:
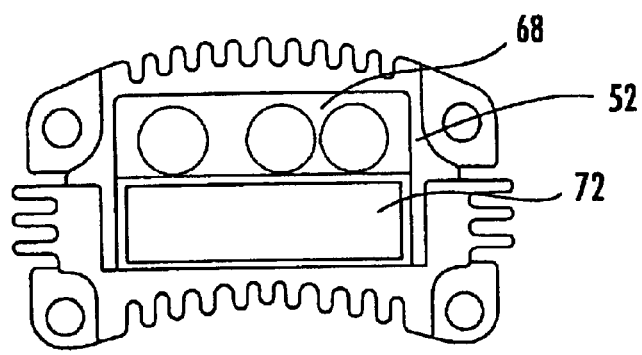
Figure 18:
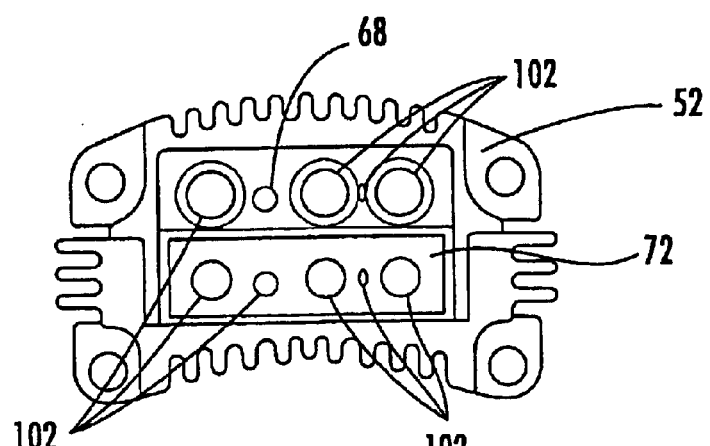

As shown in FIG. 16, solder paste 102 is added to the interior surface of the diode receiving cavity 69 in two opposed places near the rear edge. The insulated conductive substrate 72 is placed onto the solder paste such that the lower, i.e., smaller surface of the copper layer, forming the upper conductive layer or surface 74 shown in FIG. 9 faces up, as shown in FIG. 17. As shown in FIG. 18, the solder paste 102 is added onto the insulated conductive substrate 72 and onto the remaining, exposed surface of the diode receiving cavity 68, as shown in FIG. 18.

Figure 19:
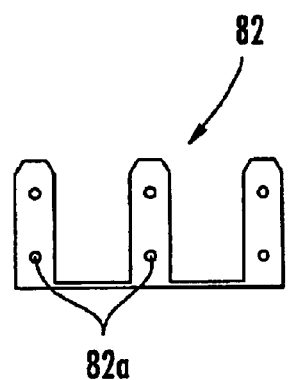
Figure 20:
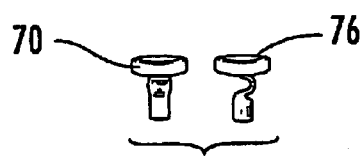
Figure 21:
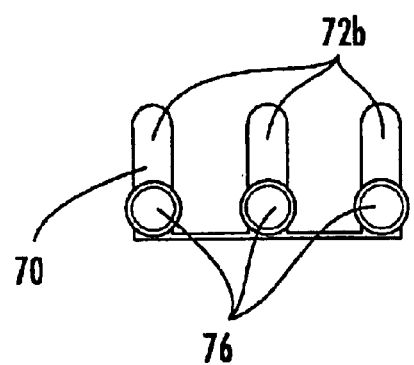

As shown in FIG. 19, the leads of positive diodes 76 are inserted into the diode terminal connector 82 in three positive diode lead receiving holes 82a. As shown in FIG. 20, the lead for the positive diode is longer than that of the negative diode. The lead of each negative diode 70 is inserted into the diode receiving holes 72b of the terminal connector, as shown in FIG. 21.

Figure 22:
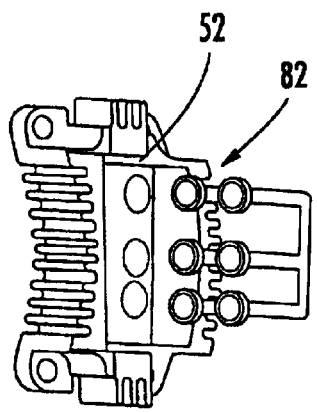

As shown in FIG. 22, the diodes and terminal connector are carefully placed into the diode receiving cavity such that the diodes are set into the solder paste 102. The positive diodes are positioned on the insulated conductive substrate and the negative diodes are secured against the interior surface of the diode receiving cavity.

Figure 23:
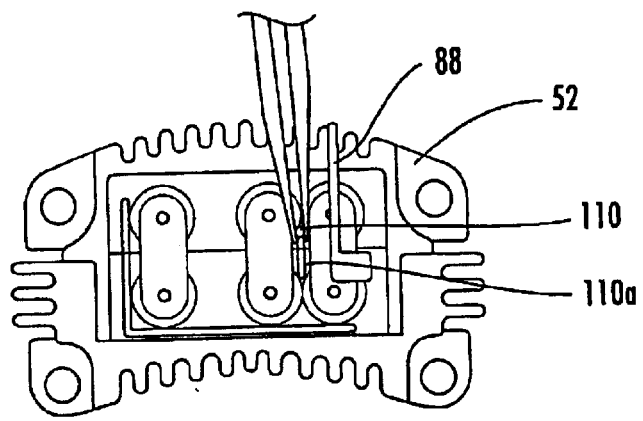

As shown in FIG. 23, a capacitor 110 is secured by its capacitor leads 110a onto the solder paste, shown in FIG. 18. The capacitor retains charge during rectification of current and acts as a filter circuit, as known to those skilled in the art.

Figure 24:
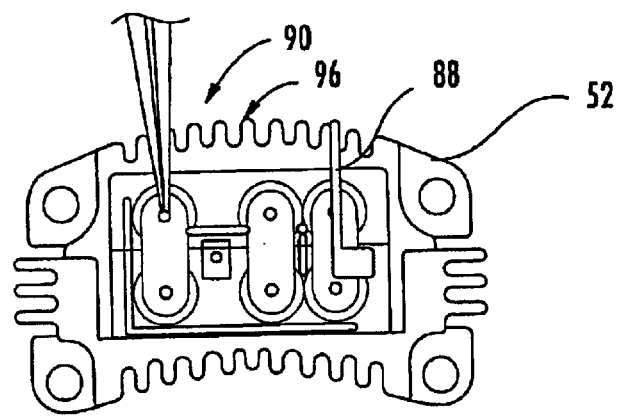
Figure 25:
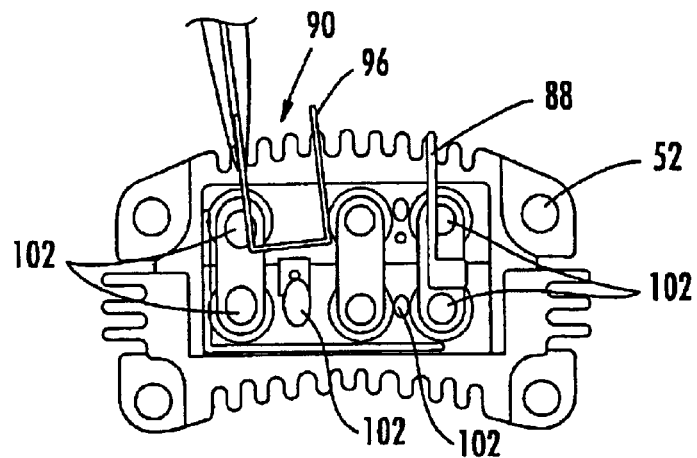

As shown in FIG. 24, the terminal connector 90 acting as a B+ post is inserted such that its foot member 92 is positioned on the remaining solder paste. Solder paste 102 is added onto the diode terminal interfaces, capacitor leads and on top of the tab, as shown in FIG. 25.

Figure 26:
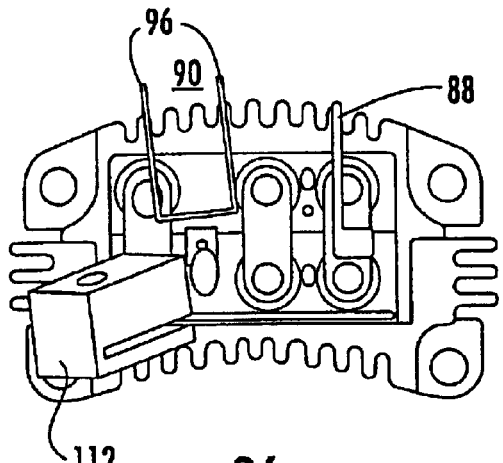
Figure 27:
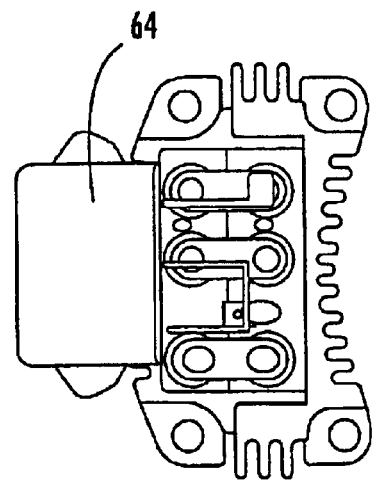
Figure 28:
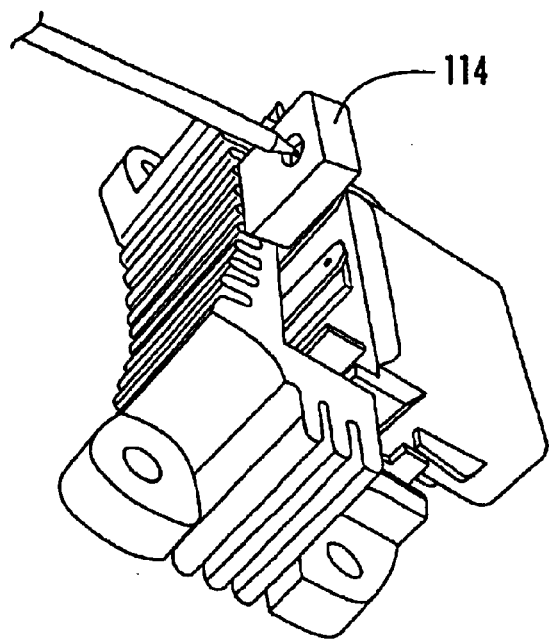
Figure 29:
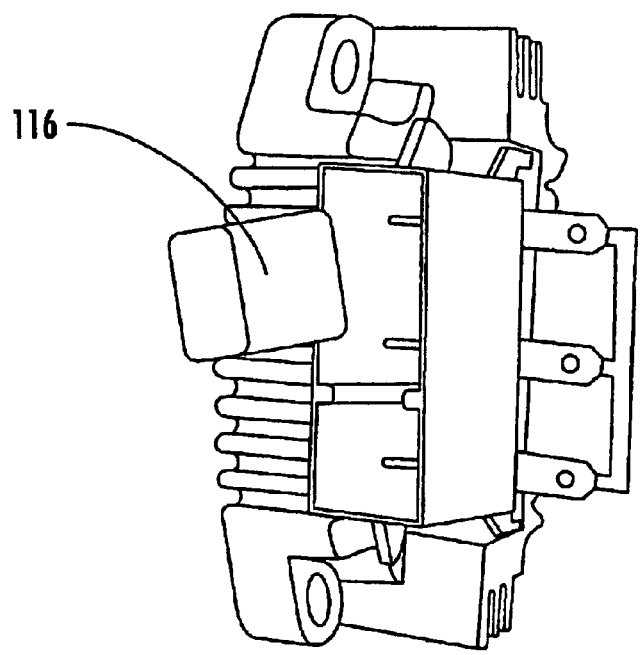
Figure 30:
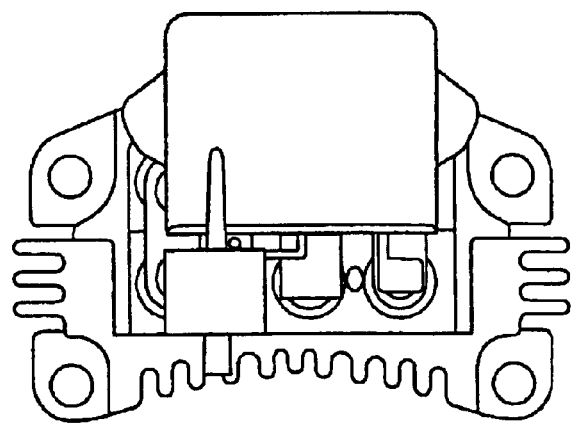
Figure 31:
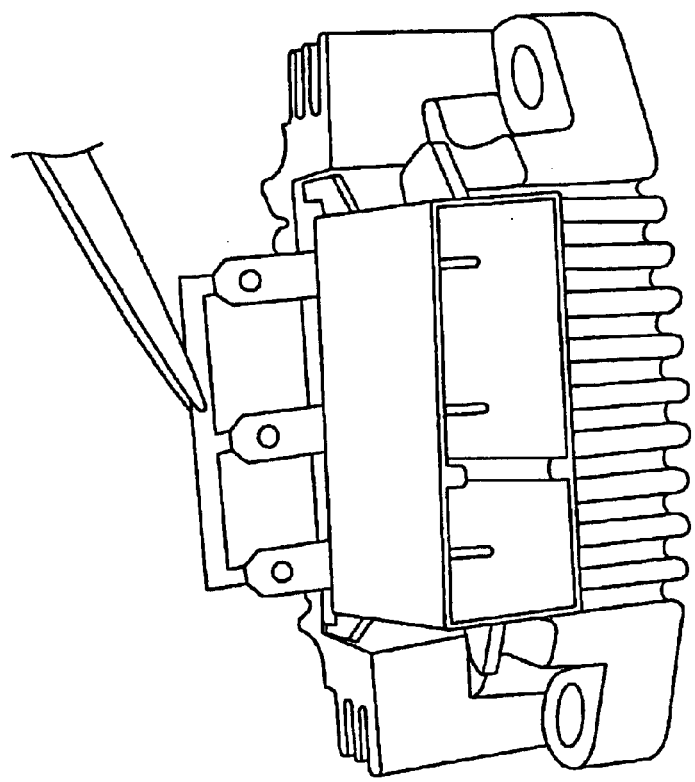

A terminal setting fixture 112 is slid over the dual terminals 96 and terminal blade 88 as shown in FIG. 26. While holding the terminal setting fixture, the connector housing 98 is slid onto the terminals, as shown in FIG. 27. A slide pin 114 that is used to hold the various pieces together is slid into the terminal setting fixture 112 as shown in FIG. 28. A flat bar 116 is inserted between the connectors and terminals as shown in FIG. 29. When all components are positioned correctly and rechecked for accuracy, and all parts are seated correctly in the solder paste, the assembly is placed into a reflow high temperature solder oven (not shown). Once reflow soldering occurs, the alignment bar 86 that aided the alignment of the terminals is broken. The assembly is tested and once it has passed testing, the epoxy filter 100 is inserted into the remaining portion of the diode receiving cavity.

It is evident that the method of the present invention facilitates easy assembly with a limited number of equipment parts and assembly steps and produces a rectifier that is sufficient and has excellent heat exchange between the diodes, rectifier body, alternator body, and automotive components.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of forming a rectifier for an alternator comprising the steps of:
   securing an insulated conductive substrate within a diode receiving cavity of an integrally formed rectifier body having a ground engaging surface opposite the diode receiving cavity where the ground engaging surface mounts within an alternator and is grounded through an automotive grounding system;
   inserting the leads of positive and negative diodes within a terminal connector that interconnects same; and
   inserting the interconnected positive and negative diodes within the diode receiving cavity such that negative diodes engage the rectifier body and are grounded thereto and positive diodes engage the insulated conductive substrate and are insulated from the negative diodes and ground engaging surface.

2. A method according to claim 1, and further comprising the step of securing the negative and positive diodes within the diode receiving cavity by applying solder paste to the rectifier body within the diode receiving cavity and onto the insulated conductive substrate and securing the negative and positive diodes thereto.

3. A method according to claim 1, and further comprising the step of securing a capacitor within the diode receiving cavity such that the capacitor is operatively connected to the negative and positive diodes.

4. A method according to claim 1, and further comprising the step of filling the diode receiving cavity with an epoxy filler after the diodes are secured therein.

5. A method according to claim 1, and further comprising the step of reflow soldering the rectifier in a solder oven for final assembly.

6. A method according to claim 1, and further comprising the step of inserting a connector housing over the terminal connector, wherein the connector housing has a connection for receiving a wiring harness and establishing electrical contact with the terminal connector.

7. A method according to claim 1, and further comprising the step of securing a terminal connector to the insulated conductive substrate and having a terminal for connecting to a wiring harness.

8. A method of forming a rectifier for an alternator comprising the steps of:
   securing an insulated metal conductive substrate within a diode receiving cavity of an integrally formed rectifier body; and
   inserting positive and negative diodes within the diode receiving cavity such that negative diodes engage the rectifier body and are grounded thereto and positive diodes engage the insulated metal conductive substrate and are insulated from the negative diodes.

9. A method according to claim 8, and further comprising the step of interconnecting leads of positive and negative diodes.

10. A method according to claim 8, and further comprising the step of securing the negative and positive diodes within the diode receiving cavity by applying solder paste to the rectifier body within the diode receiving cavity and onto the insulated metal conductive substrate and securing the negative and positive diodes thereto.

11. A method according to claim 8, and further comprising the step of securing a capacitor within the diode receiving cavity such that the capacitor is operatively connected to the negative and positive diodes.

12. A method according to claim 8, and further comprising the step of filling the diode receiving cavity with an epoxy filler after the diodes are secured therein.

13. A method according to claim 8, and further comprising the step of reflow soldering the rectifier in a solder oven for final assembly.

14. A method according to claim 8, and further comprising the step of securing a terminal connector to the insulated metal conductive substrate and having a terminal for connecting to a wiring harness.

15. A method of forming a rectifier for an alternator comprising the steps of:
   inserting positive and negative diodes within a diode receiving cavity of an integrally formed rectifier body such that negative diodes engage the rectifier body and are grounded thereto and positive diodes are insulated from the negative diodes and ground engaging surface; and
   securing a capacitor within the diode receiving cavity such that the capacitor is operatively connected to the negative and positive diodes.

16. A method according to claim 15, and further comprising the step of securing an insulated metal conductive substrate within the diode receiving cavity before inserting the diodes such that positive diodes engage the substrate and are insulated from the negative diodes.

17. A method according to claim 16, and further comprising the step of securing the negative and positive electrodes within the diode receiving cavity by applying solder paste to the rectifier body within the diode receiving cavity and onto the insulated conductive substrate and securing the negative and positive diodes thereto.

18. A method according to claim 17, and further comprising the step of filling the diode receiving cavity with an epoxy filler after the diodes are secured therein.

19. A method according to claim 15, and further comprising the step of reflow soldering the rectifier in a solder oven for final assembly.

* * * * *